US006708515B2

(12) United States Patent
Malone et al.

(10) Patent No.: US 6,708,515 B2
(45) Date of Patent: Mar. 23, 2004

(54) PASSIVE SPRAY COOLANT PUMP

(75) Inventors: Christopher G. Malone, Folsom, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 289 days.

(21) Appl. No.: 09/945,046

(22) Filed: Aug. 31, 2001

(65) Prior Publication Data

US 2002/0113141 A1 Aug. 22, 2002

Related U.S. Application Data

(60) Provisional application No. 60/271,277, filed on Feb. 22, 2001.

(51) Int. Cl.[7] .............................................. F25D 17/03

(52) U.S. Cl. .......................................... 62/259.2; 62/64

(58) Field of Search ............. 62/64, 259.2; 165/104.33, 165/80.4; 361/699

(56) References Cited

U.S. PATENT DOCUMENTS

| 2,643,282 A | 6/1953 | Greene | 174/15 |
| 2,849,523 A | 8/1958 | Narbut | 174/15 |
| 2,858,355 A | 10/1958 | Narbut | 174/15 |

(List continued on next page.)

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.–Sep., 1992, vol. 6, No. 3, pp 505–511.

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp 1–6.

Morgan, Michael J., Chang, Won S., Pais, Martin R. and Chow, Louis C., "Comparison of High Heat–Flux Cooling Applications," SPIE, 1992, vol. 1739, pp17–28.

Lee, Chin C., andChien, David H., "Thermal and Package Design of High Power Laser Diodes," IEEE, 1993, Ninth IEEE Semi–Therm Symposium, pp 75–80.

Sehmbey, Mainder S., Chow, Louis C., Pais, Martin R. and Mahefkey, Tom, "High Heat Flux Spray Cooling of Electronics," American Institute of Physics, Jan., 1995, pp 903–909.

Mudawar, I. and Estes, K.A., "Optimizing and Predicting CHF in Spray Cooling of a Square Surface," Journal of Heat Transfer, Aug., 1996, vol. 118, pp 672–679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

*Primary Examiner*—Melvin Jones

(57) ABSTRACT

A semiconductor chip cooling system having a body that forms a cavity configured to create a spray chamber when conformingly adjoined to a chip, or to a substrate or printed circuit board carrying one or more chips. Inkjet-type sprayers are configured to spray cooling fluid down on the chip. A controller transmits a control signal to the sprayer to cause the sprayer to spray at a rate leading to the cooling fluid being vaporized by the semiconductor device. The cooling system uses cooling fluid surface tension forces to draw liquid cooling fluid up a porous member from the spray chamber back to the sprayers, to be sprayed again. The cooling system uses gravity and/or pressure within the spray chamber to direct vaporized cooling fluid upward from the spray chamber to a condenser. The condenser is configured to cool and condense the vapor. A reservoir is positioned below the condenser and above the sprayers so as to receive condensed vapor from the condenser and feed it to the sprayers.

36 Claims, 5 Drawing Sheets

U.S. PATENT DOCUMENTS

| | | | | |
|---|---|---|---|---|
| 2,875,263 | A | 2/1959 | Narbut | 174/15 |
| 4,141,224 | A | 2/1979 | Alger et al. | 62/514 R |
| 4,290,274 | A | 9/1981 | Essex | 62/157 |
| 4,352,392 | A | 10/1982 | Eastman | 165/104.25 |
| 4,490,728 | A | 12/1984 | Vaught et al. | 346/1.1 |
| 4,500,895 | A | 2/1985 | Buck et al. | 346/140 R |
| 4,559,789 | A | 12/1985 | Riek | 62/157 |
| 4,576,012 | A | 3/1986 | Luzenberg | 62/157 |
| 4,683,481 | A | 7/1987 | Johnson | 346/140 R |
| 4,685,308 | A | 8/1987 | Welker et al. | 62/171 |
| 4,794,410 | A | 12/1988 | Taub et al. | 346/140 R |
| 5,131,233 | A * | 7/1992 | Cray et al. | 62/64 |
| 5,220,804 | A | 6/1993 | Tilton et al. | 62/64 |
| 5,278,584 | A | 1/1994 | Keefe et al. | 346/140 R |
| 5,434,606 | A | 7/1995 | Hindagolla et al. | 347/45 |
| 5,718,117 | A | 2/1998 | McDunn et al. | 62/64 |
| 5,724,824 | A | 3/1998 | Parsons | 62/171 |
| 5,907,473 | A | 5/1999 | Przilas et al. | 361/699 |
| 5,924,198 | A | 7/1999 | Swanson et al. | 29/890.1 |
| 5,943,211 | A | 8/1999 | Havey et al. | 361/699 |
| 6,108,201 | A | 8/2000 | Tilton et al. | 361/689 |
| 6,182,742 | B1 | 2/2001 | Takahashi et al. | 165/104.33 |
| 6,205,799 | B1 | 3/2001 | Patel et al. | 62/132 |

\* cited by examiner

PASSIVE SPRAY COOLANT PUMP

The present application claims priority from U.S. provisional patent application, Serial No. 60/271,277, filed Feb. 22, 2001, which is incorporated herein by reference for all purposes.

The present invention relates generally to cooling systems for heat-generating devices and, more particularly, to a spray cooling system and a method of using the spray cooling system to cool one or more semiconductor components (i.e., chips).

BACKGROUND OF THE INVENTION

With the advent of semiconductor devices having increasingly large component densities, the removal of heat generated by these devices has become an increasingly challenging technical issue. Moreover, device miniaturization has led device designers to integrate previously separate components, such as those used to create a cache for a microprocessor, into the microprocessor die. This consolidation of devices has resulted in high CPU core power density, and extreme power dissipation requirements.

The use of boiling/vaporizing methods with inert cooling fluids provides cooling levels that can meet extreme cooling requirements. While pool boiling (i.e., submerging a chip in coolant) provides significant gains over traditional air cooling, spray cooling (i.e., spraying the chip with coolant) presently provides the highest heat dissipation levels for a heat-generating device such as a semiconductor chip. The best results are obtained when the coolant is uniformly sprayed over each area having a uniform dissipation requirement. The mass flow rate of sprayed coolant should be at a level such that the energy needed to vaporize the sprayed coolant matches the power dissipation requirements of the device.

With reference to FIG. 1, in single, high-dissipation, spray cooling system, an inert spray coolant from a reservoir 11 is preferably sprayed by a group of one or more sprayers 13 onto an aligned group of one or more chips 15 mounted on a printed circuit board 17. The coolant preferably evaporates, dissipating heat within the chip. The sprayers, the chips and the board are mounted within an evacuated and sealed case 19 fixed within a computer system. The sprayed coolant is typically gathered and cooled within a condenser 21, and then routed back to the reservoir by a pump 23. For semiconductor devices, low boiling point fluids such as 3M® FC-72 (FED. CIR.-72, i.e., FLUORINERT®, sold by 3M® Corporation), 3M's Novec line of fluids (HFE 7100, etc., sold by 3M® Corporation) or PF-5060 are among a number of known suitable cooling liquids.

Modern systems using high-dissipation chips frequently have a variety of chips requiring different levels of cooling, only some of which are extreme. Depending on an electronic system's design, components containing these chips can be located throughout the system. Because they have high dissipation requirements, the chips are not easily cooled using conventional air-cooling. Because the chips are spread out, they are not easily cooled by high-dissipation spray cooling systems, which are typically complex systems. Such cooling systems will typically require either the expense of providing separate components for each individual cooling system, or the expense of interconnecting a group of cooling systems to one or more shared components (e.g., shared pumps, condensers and/or reservoirs). Therefore, high-dissipation cooling systems can be expensive and complicated to implement in complex systems having numerous hot components.

The nozzle design is a key component of spray cooling. Pressure assisted and gas assisted nozzles are known designs. However, these types of nozzles are limited in their ability to control the mass flow rate at which they spray. Therefore, they can cause "pooling" (i.e., a buildup of liquid on the cooled device due to excessive spray rates), which decreases spray cooling effectiveness.

Additionally, pressure-assisted spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control. Gas atomized spraying requires the delivery of both cooling fluid and a pressurized gas to a spray head in a precise manner. Because the gas must be pressurized separately from the cooling fluid, such systems are not typically closed systems, which invites contamination. Thus, both types of spray cooling system are sensitive and potentially expensive devices that can be a challenge to control.

Furthermore, spray cooling systems rely on both active sprayer systems and active condensing systems to operate. If either system fails, the cooling system likely becomes inoperative, potentially leading to the failure and destruction of the cooled component(s).

Accordingly, there has existed a need for a spray cooling system that can be implemented efficiently and cost effectively in multiple locations in a complex system with high reliability. Various embodiments of the present invention satisfy these and/or other needs, and provide further related advantages.

SUMMARY OF THE INVENTION

In various embodiments, the present invention solves some or all of the needs mentioned above by providing a cooling system that efficiently operates on high-dissipation devices using reliable, passive coolant pumps to cycle coolant.

The system is configured for transferring cooling fluid, which has been sprayed by a sprayer head onto a heat source, back up from a pool to the sprayer head. The system features a member extending from the pool to the sprayer head, the member forming a passageway leading from the pool to the sprayer head. The member is configured such that cooling fluid surface tension forces will draw the cooling fluid upward through the passageway from the pool to the sprayer head. Advantageously, the member provides a passive pump that does not require power, a control system or moving parts. It is thus relatively durable and reliable. The system further features a porous material configured to increase the pumping ability of the passive pump.

The system includes a condenser configured to remove heat from vaporized coolant, and a reservoir in fluid communication with the condenser. The reservoir receives coolant that is condensed by the condenser. The system features a structure defining an open passageway extending from the spray chamber to the condenser. The passageway advantageously provides for vaporized coolant to pass to the condenser under gravitational and vapor pressure forces without the need for an active pump.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples thereof.

Evaporative spray cooling promises to be a technology that can deliver high performance cooling. To minimize the installation and operating costs, while maximizing the reliability, it is preferable to use passive systems rather than active ones. The present invention resides in a preferably closed loop, integrated, single chip or multi-chip module-level spray cooling system, preferably comprising thermal inkjet heads, a condenser, a reservoir and a passive coolant pump. The design is preferably a singular assembly that can be attached to the device(s) that need to be spray cooled.

Figure 1:
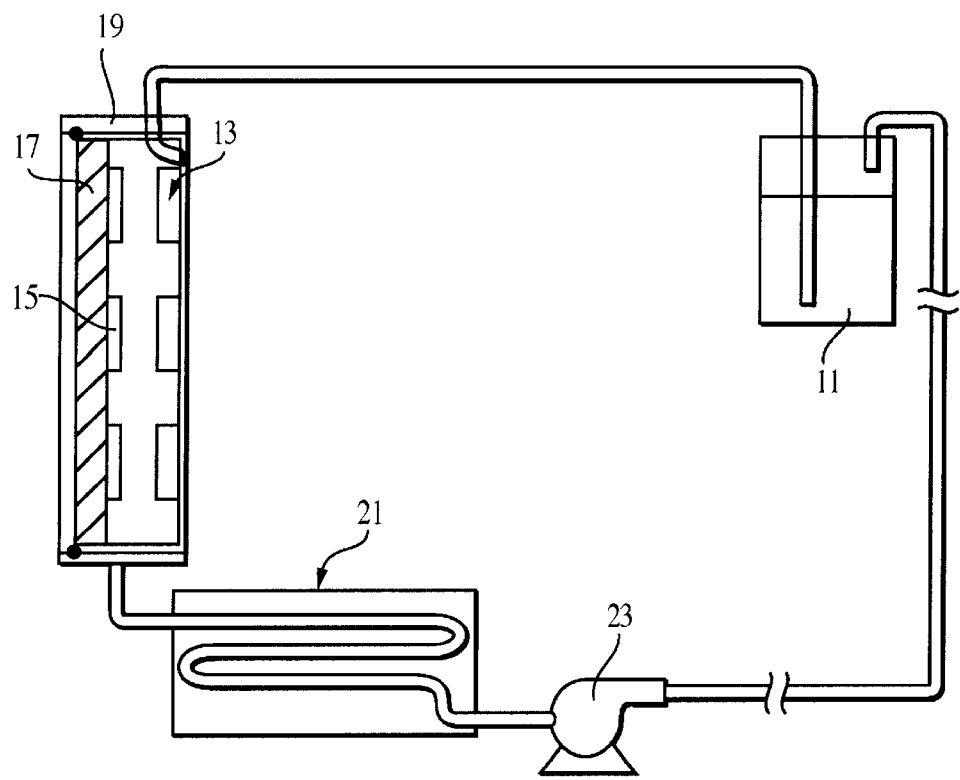
FIG. 1 is a system layout of a spray cooling system.
Figure 2:
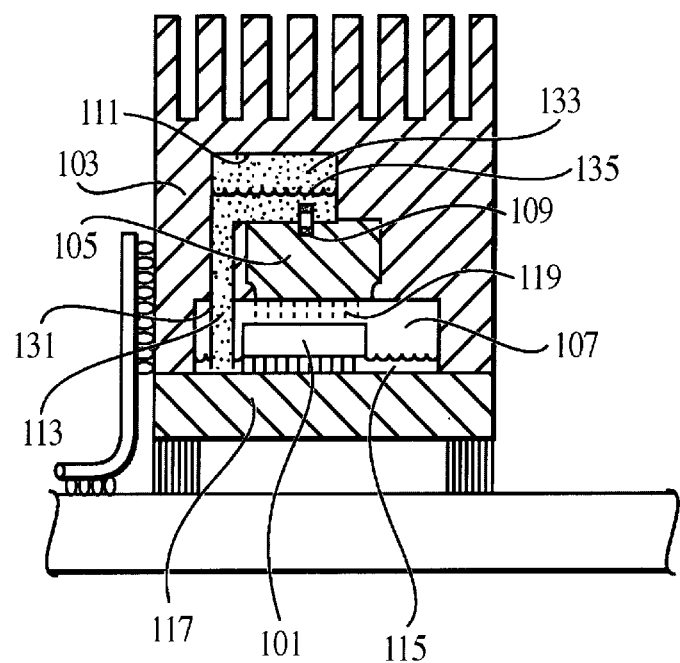
FIG. 2 is a cross-sectional, elevational view of a first embodiment of a cooling system of the invention.

With reference to FIG. 2, a first embodiment of a cooling system provides for cooling a component including one or more heat-producing devices such as chips 101 composed of heat-generating semiconductor devices. The cooling system includes a body forming a cooling cap 103, and one or more sprayers on a sprayer head 105. The cap and sprayer head are preferably integrated into a single cooling assembly. The cap is configured to form a spray chamber 107 in which cooling fluid can be sprayed into thermal contact with, and preferably directly onto, the chip. The sprayer head includes a manifold inlet 109 for receiving cooling fluid in a liquid state from a reservoir 111. A member 113 extends from the sprayer head's manifold inlet down to the bottom of the spray chamber with respect to gravity. The member is configured as a passive, capillary-action coolant pump to pump any liquid cooling fluid that has formed a pool 115 in the spray chamber upward to the sprayer head.

Preferably, the cap 103 includes a concave portion having surfaces that form a cavity configured to conformingly adjoin to one or more surfaces of a component substrate 117 that is both electrically connected to and carrying the chips 101. The substrate can be a plastic, silicon, ceramic or composite material or the like, or even a printed circuit board or other device directly or indirectly carrying one or more heat sources. The component substrate and chip form a package with which the cap is associated. The package is preferably in the conventional form of an integrated circuit component that has not received an encapsulant or lid.

When the cavity of the cap conformingly adjoins the component substrate, the spray chamber 107 is formed, containing at least the portions of the semiconductor devices to be spray cooled. The adjoined cap positions the sprayer head 105 to spray the chips 101, and preferably aligns them to each other. The cap is preferably made of a material having a thermal coefficient of expansion substantially matching that of the component substrate. Preferably, the cap is retained against the component substrate by an adhesive, a clamping mechanism, fasteners, or other attachment-type mechanisms, and a seal is formed such that liquid and vapor cooling fluid do not escape the spray chamber other than through designed orifices. The component substrate is preferably configured to be vapor and liquid tight, but could be configured with an orifice leading to an exterior member rather than the interior one shown. The cap forms a package-level cooling system to be affixed to the package and thereby form a cooled package.

The sprayer head 105 is configured to spray coolant 119 onto the one or more chips 101, which heats and vaporizes at least some cooling fluid. The cooling fluid vapor that forms during the cooling process is retained in the spray chamber 107, dissipating its heat into the walls of the spray chamber and then condensing into the pool. The chamber walls in turn dissipate the heat via any of a variety of standard heat sink technologies.

Preferably, the sprayers in the sprayer head 105 are incremental sprayers configured to eject an incremental amount of the cooling fluid on the chips. The cooling fluid is typically sprayed in response to an energizing control signal, which is sent to the sprayers by a controller. The quantity of liquid sprayed from incremental sprayers can be highly controllable, such as by controlling the rate at which incremental amounts of cooling fluid are ejected.

A preferred type of incremental sprayer for the sprayer head 105 is an inkjet-type sprayer. In particular, with reference to FIG. 3, which shows two thermal inkjet (TIJ) sprayers, each TIJ sprayer includes structure defining an ejection chamber 201 for receiving a predetermined portion of cooling fluid, and a heater 203 for vaporizing a sub-portion of the predetermined portion cooling fluid to create the pressure to eject an incremental amount of cooling fluid through an orifice 205 that directs the ejected cooling fluid toward the chip 101 (FIG. 2). The orifices are preferably formed in a flexible polymer tape 207, e.g., a polyimide tape such as is sold under the mark KAPTON.®

Affixed to a back surface 209 of the tape 207 is a silicon substrate 211 containing the heaters 203, in the form of individually energizable thin-film resistors. Each heater is preferably located on a side of the ejection chamber 201 across from the ejection chamber's orifice 205. Cooling fluid is preferably drawn and loaded into the ejection chamber by capillary action from a manifold passage 213, as is typical for an ink-jet type device. Preferably, a computerized controller (not shown) energizes the heater, vaporizing the portion of the cooling fluid adjacent to the heater. The vaporized cooling fluid expands, expelling most of the non-vaporized cooling fluid out of the orifice, typically in the form of one or more droplets.

Figure 3:
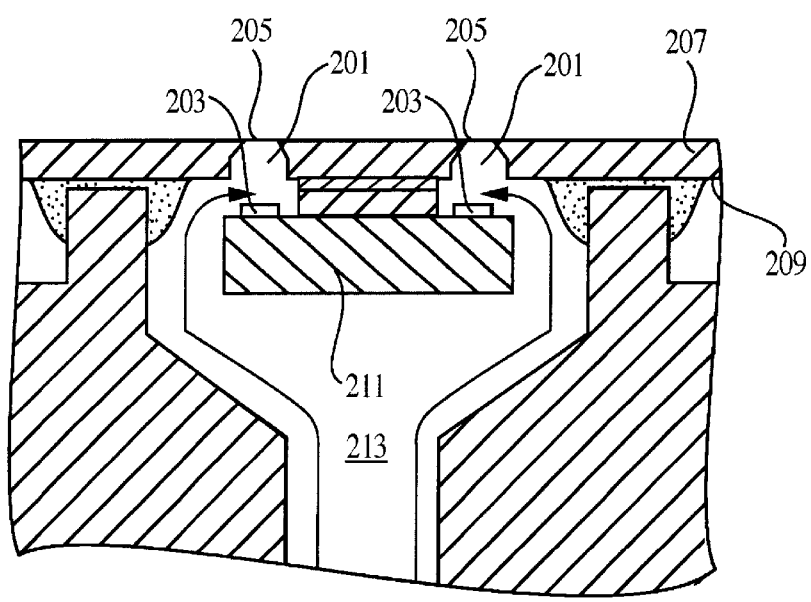
FIG. 3 is a cross-sectional view of a pair of incremental sprayers as used in the cooling system depicted in FIG. 2.

With reference to FIGS. 2 and 3, to form a passive capillary-action pump, the member 113 preferably forms a passageway leading from the pool 115 to the manifold inlet 109 of the sprayer head 105. The member is configured such that coolant surface tension forces will draw the coolant upward from the pool to the manifold inlet. In particular, the member preferably includes a tubular portion 131 extending from the pool 115 to the manifold inlet 109, forming the exterior of the passageway, and a porous material 133 contained within the tubular portion. The tubular portion can optionally be formed entirely within the walls of the cooling cap 103, or can even extend outside the cooling cap. The upper end of the tubular portion forms the reservoir 111.

The passageway formed through the pores of the porous material 133, within the tubular portion 131, is preferably characterized by a continually varying cross-section along a vertical axis. The porous material can be a sponge, sintered copper, fiber bundles, grooved metal, wire mesh, or the like. A number of potentially usable porous materials are used in the art of heat pipes.

The porous material's pore size is small enough for capillary/surface tension forces to draw the liquid coolant up to the top of the tubular portion 131 and into the porous material in the reservoir 111. Preferably, the pore size is small enough to cause the coolant to rise to a level 135 at least partway up the reservoir. More preferably it will fill the reservoir, placing the fluid in thermal contact with the top of the reservoir, and thus the heat sink that tops the package. Even more preferably, the pore size is such that the surface tension forces are strong enough to raise the fluid higher, if the reservoir were extended upward. This might empower the tubular portion to draw fluid up at a higher rate of speed, allowing spray at a greater rate.

The reservoir extends above the sprayer head's manifold inlet 109, and the pore size of the porous material is also selected to be large enough to allow the sprayer head's manifolds, leading from the manifold inlet 109 to the ejection chambers 201, to draw coolant from the porous material via capillary forces and/or gravity.

Optionally, part or all of the tubular portion can be vacant of porous material. In that case, that portion of the tubular portion is preferably configured with a cross sectional area such that capillary forces of the coolant within the tubular portion can draw the coolant upward to the porous material or the manifold inlet. In particular, porous material might not be needed in the lower portions of the tubular portion, where wider passage size may be adequate to raise the fluid for a limited distance. Alternatively, if the system contains adequate coolant to assure that the pool will keep the end of the tubular portion submerged, a greater length of the tubular portion, perhaps extending all the way up to the reservoir, can be left without porous material, as the capillary forces in the porous material might syphon the coolant up the lower part of the tubular portion.

Preferably the cooling system is designed to hold a continuing pool 115 of liquid below the chip 101 to maintain a continuous line of liquid throughout the member 113. Preferably the entire reservoir is contained within the porous material 133. The pool can optionally be designed to contact lower portions of the chip, so long as the sprayed portions do not become submerged. Furthermore, the member can be designed with multiple branches that contact different parts of the spray chamber, allowing the device to be used in varying orientations with respect to gravity. Indeed, the entire spray chamber can be lined with porous material to aid in drawing excess fluid from around the chip.

The incremental sprayers can alternatively be based on other types of ink-jet droplet expelling technology, such as piezoelectric technology (i.e., piezoelectric nozzles). Examples of this technology are discussed in numerous U.S. Patents, including U.S. Pat. Nos. 5,924,198, 4,500,895, and 4,683,481, which are incorporated herein by reference for all purposes. Other thermal ink-jet technologies can likewise be appropriate for use for inkjet spray cooling. A highly preferable cooling fluid for use with a thermal incremental sprayer is 3M® FLUORINERT®, which is adaptable to existing thermal ink-jet technology.

Figure 4:
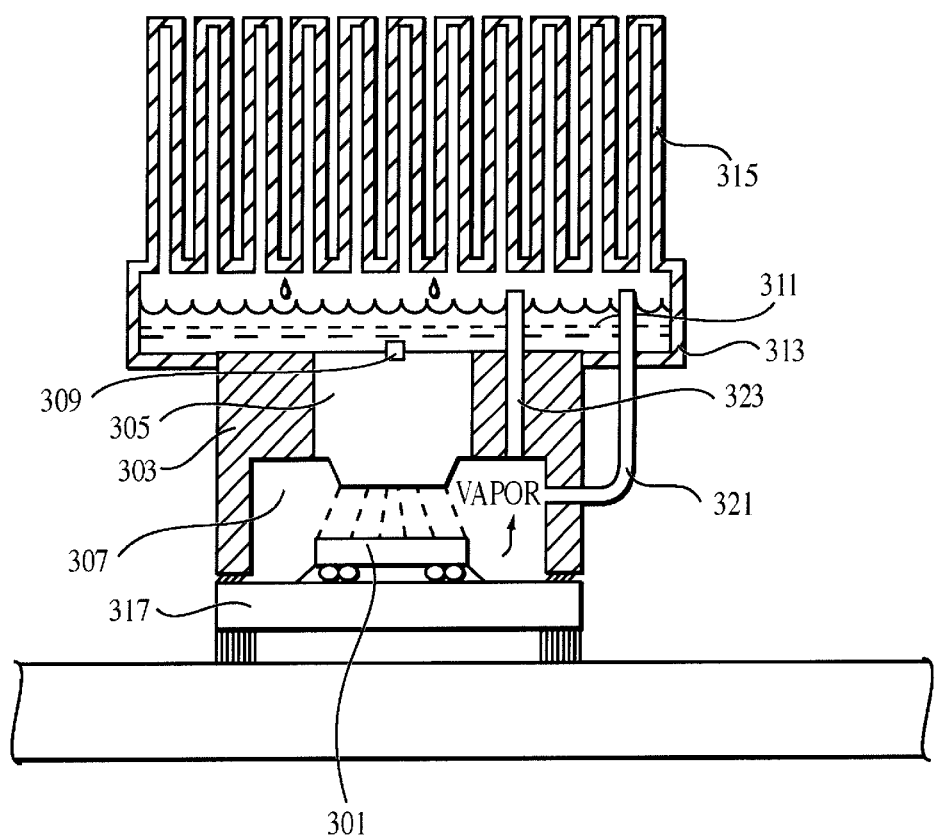
FIG. 4 is a cross-sectional, elevational view of a second embodiment of a cooling system of the invention.

With reference to FIG. 4, a second embodiment of the invention also provides for cooling a component including one or more heat-producing devices such as one or more chips 301 composed of heat-generating semiconductor devices. Similar to the first embodiment, the cooling system includes a body forming a cooling cap 303, and one or more sprayers in a sprayer head 305. The cap and sprayer head are preferably integrated into a single cooling assembly. The cap is configured to form a spray chamber 307 in which cooling fluid can be sprayed into thermal contact with, and preferably directly onto, the chip. The sprayer head includes a manifold inlet 309 for receiving coolant 311 in a liquid state from a reservoir 313. The reservoir is in fluid communication with, and preferably forms a single chamber that is integral with, a condenser 315. The cap includes structures to adjoin to a substrate 317, similar to the first embodiment.

The sprayer head 305 is configured to spray coolant 311 onto the chip 301, which heats and vaporizes at least some of the coolant. Any coolant that does not vaporize runs off the chip onto the substrate, and eventually evaporates from heat in the surrounding environment, such as heat radiating from the chip and/or the substrate, which may be heated by the chip. Alternatively, the liquid coolant can be pumped up to the reservoir 313. If the liquid is to be pumped, the pump is preferably a passive, capillary-action pump (i.e., a device that moves fluid upward through capillary forces) as described above, rather than an active mechanical pump that can suffer from mechanical reliability problems. This is further described in the third embodiment, below. As in the first embodiment, preferably, the sprayer head 305 includes incremental sprayers, and more preferably, incremental TIJ sprayers.

The coolant vapor is directed or fed to the condenser 315, through one or more vapor pipes configured for carrying vapor. In particular, a vapor pipe can be formed from external structure 321 that forms an unobstructed passageway from the spray chamber to the condenser, or from internal structure 323 of the cooling cap that forms an unobstructed passageway from the spray chamber to the condenser. The vaporized coolant flows to the condenser via gravity (i.e., buoyancy), and/or via vapor static pressure that builds up in the cavity. If the reservoir and condenser are formed integrally (as shown), the pipe preferably opens into the condenser at a level above the fluid level in the reservoir.

The condenser 315 can be any of a variety of designs using various heat sink technology. Vapor condensed in the condenser flows via gravity to join the liquid in the reservoir 313. The reservoir is preferably located above the sprayer head, such that gravity (and/or capillary forces) will draw the liquid into the sprayer manifold 309 from the reservoir to service the spray nozzles. A passive thermosyphon pump is thus created that does not require an active pump to move cooling fluid through the closed loop system.

Figure 5:
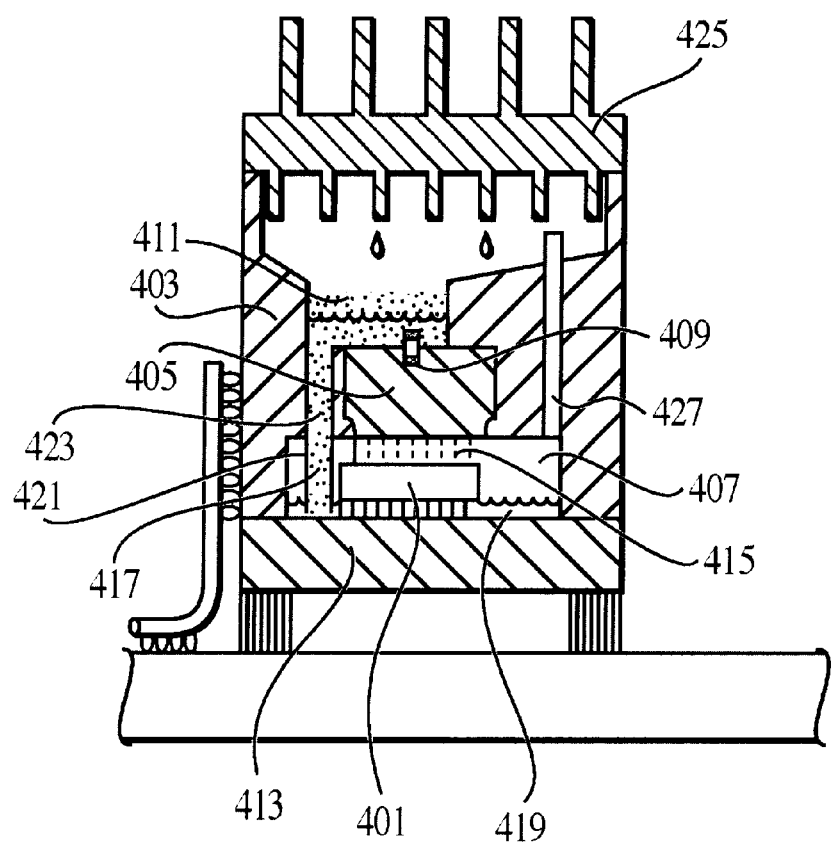
FIG. 5 is a cross-sectional, elevational view of a third embodiment of a cooling system of the invention.

With reference to FIG. 5, a third embodiment of a cooling system provides for cooling a component including one or more heat-producing devices such as chips 401 composed of heat-generating semiconductor devices. The third embodiment combines features of the first two embodiments and should be understood to incorporate their features.

The cooling system includes a body forming a cooling cap 403, and at least one sprayer in a sprayer head 405. The cap and sprayer head are preferably integrated into a single cooling assembly. The cap is configured to form a spray chamber 407 in which cooling fluid can be sprayed into thermal contact with, and preferably directly onto, the chip 401. The sprayer head includes a manifold inlet 409 for receiving cooling fluid in a liquid state from a reservoir 411. Preferably, the cap includes a concave portion having surfaces that form a cavity configured to conformingly adjoin to one or more surfaces of a component substrate 413 that is both electrically connected to and carrying the chip 401. The sprayer head 405 is configured to spray coolant 415 onto the one or more chips 401, which heats and vaporizes at least some cooling fluid.

A member 417 extends from the sprayer head down to the bottom of the spray chamber with respect to gravity. The member is configured as a passive, capillary-action pump to pump any liquid cooling fluid that has formed a pool 419 in the spray chamber upward to the sprayer head. The member preferably includes a tubular portion 421 and a porous material 423 contained within the tubular portion.

The coolant vapor is directed or fed to a condenser 425, through structure 427 forming one or more internal or external vapor pipes configured for carrying vapor to the condenser of the cooling cap, the pipes forming a relatively unobstructed passageway from the spray chamber to the condenser. The vaporized coolant flows to the condenser via gravity (i.e., hot gas rising), and/or via vapor static pressure that builds up in the spray chamber. If the reservoir and condenser are formed integrally, the pipe preferably opens into the condenser at a level above the fluid level in the reservoir. The reservoir and condenser are configured such that coolant that condenses in the condenser flows into the reservoir, and most preferably into the porous material of the capillary pump.

Preferably, the sprayer head's sprayers are incremental sprayers configured to eject an incremental amount of cooling fluid on the chips. A preferred type of incremental sprayer is an inkjet-type sprayer.

As in the first embodiment, the porous material's pore size is small enough to draw the liquid coolant up the tubular portion 421 and into the porous material 423 in the reservoir 411. Preferably, the pore size is small enough to cause the coolant to rise to a level partway up the reservoir, but large enough so that it either does not reach the top of porous material, or it only barely reaches the top. The reservoir extends above the sprayer head's manifold inlet 409, and the pore size of the porous material is also selected to be large enough to allow the sprayer head's manifolds, leading from the manifold inlet to the ejection chambers, to draw coolant from the porous material via capillary forces and/or gravity.

For inkjet spray cooling systems to function at optimal efficiency, the sprayers' mass flow rate ($\dot{m}_s$) is preferably adjusted to avoid having the semiconductor device become either dry or immersed. However, using some embodiments of the present invention, excess spray can be efficiently removed from the spray chamber.

The heat sinks used in the above-described condensers can be any of a wide number of known types, such as air cooled, liquid cooled, refrigerated, and the like. Alternate variations of these embodiments could comprise other types of incremental spraying mechanisms, such as piezoelectric sprayers, or other spraying mechanisms including non-incremental sprayers. In short, the above disclosed features can be combined in a variety of configurations within the anticipated scope of the invention. Furthermore, embodiments of the invention can incorporate various combinations of the spray cooling apparatus described in U.S. Pat. No. 6,205,799, which is incorporated herein by reference for all purposes.

Generally speaking, many embodiments of the invention can be configured to be pressed onto, and develop a water-tight seal with, a component-carrying device, such as the ones depicted in FIGS. 2, 4 and 5. Alternatively, embodiments of the invention could press directly onto a covered component, or onto a component substrate carrying an uncovered chip. Alternative attachment means, such as using adhesives, are also within the scope of the invention.

While the most preferred of these embodiments of the invention are configured to replace the existing technology cover-packages with spray caps incorporated into device packages, there can be many other configurations embodying the invention. For example passive pumps can be used in traditional spray-cooling chambers that contain multiple semiconductor components on a printed circuit board.

It is to be understood that the invention comprises apparatus and methods for designing cooling systems and for producing cooling systems, and the apparatus and methods of the cooling system itself. Additionally, the various embodiments of the invention can incorporate various combinations of the features disclosed above in generally discussing an inkjet spray cooling system, and can be designed, made and operated using related methods (or portions thereof) as described above for the inkjet spray cooling system.

Furthermore, it is to be understood that cooled components, cooled singly or in groups as described above, can be mounted on circuit boards to form systems including one or more circuit boards carrying one or more cooled components that are electronically interlinked via the circuit boards. Such systems are also within the scope of the invention. Additionally, groups of the cooled components combined with one or more cooling fluid condensers that cool fluid from numerous cooled components are also within the scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. An apparatus for transferring cooling fluid, which has been sprayed by a sprayer head onto a heat source, upward with respect to gravity to the sprayer head, wherein at least some cooling fluid has formed a pool, comprising:

a member extending from the pool to the sprayer head;

wherein the member forms a passageway leading from the pool to the sprayer head; and wherein the member is configured such that coolant surface tension forces will draw the cooling fluid upward from the pool to the sprayer head.

2. The apparatus of claim 1, the sprayer head including a manifold configured to feed cooling fluid to a nozzle of the sprayer head, wherein the member is configured such that coolant surface tension forces within the manifold will draw cooling fluid from the passageway into the manifold.

3. The apparatus of claim 1, wherein the member is configured such that the passageway is characterized by a continually varying cross-section along a vertical axis.

4. The apparatus of claim 3, wherein the member comprises:
   a tubular portion; and
   a porous portion contained within the tubular portion, the passageway being formed through the pores of the porous portion.

5. The apparatus of claim 4, wherein the porous portion is a fiber bundle.

6. The apparatus of claim 4, wherein the porous portion is composed of sponge.

7. The apparatus of claim 4, wherein the porous portion is composed of sintered copper.

8. The apparatus of claim 4, wherein the porous portion is a length of grooved metal.

9. The apparatus of claim 4, wherein the porous portion is a wire mesh.

10. The apparatus of claim 4, the sprayer head including a manifold configured to feed cooling fluid to a nozzle of the sprayer head, wherein the pore size of the porous portion is selected such that coolant surface tension forces within the manifold will draw cooling fluid from the passageway into the manifold.

11. The apparatus of claim 1, and further comprising:
   a condenser configured to receive and cool vaporized coolant;
   a reservoir in fluid communication with the condenser such that vaporized coolant that is condensed by the condenser passes into the reservoir, wherein the reservoir is configured to feed liquid coolant to the sprayer head; and
   a structure defining a passageway extending from the spray chamber to the condenser.

12. A system for cooling a component with a sprayed cooling fluid, comprising:
   a body configured with a cavity to be retained against the component, wherein when the cavity is retained against a portion of the component, the cavity is configured to form a spray chamber in which the cooling fluid can be sprayed into thermal contact with a portion of the component;
   a sprayer head configured to spray the portion of the component when the cavity is retained against the component, and
   a member extending from the gravitational bottom of the chamber to the sprayer head, wherein the member forms a passageway leading from the gravitational bottom of the chamber to the sprayer head, and wherein the member is configured such that coolant surface tension forces will draw liquid cooling fluid upward from the gravitational bottom of the chamber to the sprayer head.

13. The system of claim 12, wherein member is integral with the body.

14. The system of claim 12, wherein the member is configured such that the passageway is characterized by a continually varying cross-section along a vertical axis.

15. The system of claim 14, wherein the member comprises:
   a tubular portion; and
   a porous portion contained within the tubular portion, the passageway being formed through the pores of the porous portion.

16. The system of claim 12, wherein the sprayer head includes an incremental sprayer configured to eject incremental amounts of cooling fluid onto the component in response to a control signal.

17. The system of claim 16, wherein the incremental sprayer is a thermal inkjet-type sprayer.

18. The system of claim 16, and further comprising a controller configured to transmit a control signal to the incremental sprayer such that the incremental sprayer ejects incremental amounts of cooling fluid at a rate leading to the cooling fluid being vaporized by the component.

19. The system of claim 12, and further comprising:
   a condenser configured to receive and cool vaporized coolant; and
   a reservoir in fluid communication with the condenser such that vaporized coolant that is condensed by the condenser passes into the reservoir, wherein the reservoir is configured to feed liquid coolant to the sprayer head;
   wherein the body forms an open passageway leading from the spray chamber to the condenser.

20. The system of claim 19, wherein the sprayer head includes an incremental sprayer configured to eject incremental amounts of cooling fluid onto the component in response to a control signal.

21. The system of claim 20, wherein the incremental sprayer is a thermal inkjet-type sprayer.

22. The system of claim 20, and further comprising a controller configured to transmit a control signal to the incremental sprayer such that the incremental sprayer ejects incremental amounts of cooling fluid at a rate leading to the cooling fluid being vaporized by the component.

23. A cooled component, comprising:
   a component;
   a coolant for spray cooling the component;
   a sprayer head configured to eject the coolant into thermal contact with the component;
   a housing forming a chamber in which the sprayer head can spray coolant into thermal contact with the component; and
   a member extending from the gravitational bottom of the chamber to the sprayer head, wherein the member forms a passageway leading from the gravitational bottom of the chamber to the sprayer head, and wherein the member is configured such that coolant surface tension forces will draw liquid coolant upward from the gravitational bottom of the chamber to the sprayer head.

24. The cooled component of claim 23, wherein the member is configured such that the passageway is characterized by a continually varying cross-section along a vertical axis.

25. The cooled component of claim 24, wherein the member comprises:
   a tubular portion; and
   a porous portion contained within the tubular portion, the passageway being formed through the pores of the porous portion.

26. The cooled component of claim 23, wherein the sprayer head includes an incremental sprayer configured to eject incremental amounts of cooling fluid onto the component in response to a control signal.

27. The cooled component of claim 26, wherein the incremental sprayer is a thermal inkjet-type sprayer.

28. The cooled component of claim 26, and further comprising a controller configured to transmit a control signal to the incremental sprayer such that the incremental sprayer ejects incremental amounts of cooling fluid at a rate leading to the cooling fluid being vaporized by the component.

29. The system of claim 23, and further comprising:
a condenser configured to receive and cool vaporized coolant; and
a reservoir in fluid communication with the condenser such that vaporized coolant that is condensed by the condenser passes into the reservoir, wherein the reservoir is configured to feed liquid coolant to the sprayer head;
wherein the housing forms an open passageway leading from the spray chamber to the condenser.

30. The system of claim 29, wherein the sprayer head includes an incremental sprayer configured to eject incremental amounts of cooling fluid onto the component in response to a control signal.

31. The system of claim 30, wherein the incremental sprayer is a thermal inkjet-type sprayer.

32. The system of claim 30, and further comprising a controller configured to transmit a control signal to the incremental sprayer such that the incremental sprayer ejects incremental amounts of cooling fluid at a rate leading to the cooling fluid being vaporized by the component.

33. An electronic device, comprising:
a plurality of the cooled components of claim 23;
wherein the plurality of cooled components are electrically interconnected.

34. A method for transferring a liquid cooling fluid, which has been sprayed by a sprayer head onto a heat source, upward with respect to gravity, from a pool of the cooling fluid to the sprayer head, comprising:
providing a member to extend from the pool to the sprayer head;
wherein the member forms a passageway leading from the pool to the sprayer head; and
wherein the member is configured such that coolant surface tension forces will draw the cooling fluid upward from the pool to the sprayer head.

35. The method of claim 34, the sprayer head including a manifold configured to feed cooling fluid to a nozzle of the sprayer head, wherein the member is configured such that coolant surface tension forces within the manifold will draw cooling fluid from the passageway into the manifold.

36. An apparatus for transferring cooling fluid that has been sprayed in a spray chamber by a sprayer head onto a heat source, back to the sprayer head, comprising:
a means for transferring sprayed cooling fluid from the spray chamber, upward with respect to gravity, to the sprayer head, wherein the means for transferring operates without moving parts.

* * * * *